United States Patent
Tsunoda

(10) Patent No.: US 10,148,065 B2
(45) Date of Patent: Dec. 4, 2018

(54) DRIVE CIRCUIT OF LIGHT EMITTING ELEMENT

(71) Applicant: FUJITSU LIMITED, Kawasaki-shi, Kanagawa (JP)

(72) Inventor: Yukito Tsunoda, Sagamihara (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/957,994

(22) Filed: Apr. 20, 2018

(65) Prior Publication Data

US 2018/0241175 A1    Aug. 23, 2018

Related U.S. Application Data

(62) Division of application No. 15/378,629, filed on Dec. 14, 2016, now Pat. No. 9,979,155.

(51) Int. Cl.
*H01S 3/00* (2006.01)
*H01S 5/042* (2006.01)
*H03K 5/156* (2006.01)
*H04B 10/50* (2013.01)

(52) U.S. Cl.
CPC ............ *H01S 5/042* (2013.01); *H01S 5/0427* (2013.01); *H03K 5/1565* (2013.01); *H04B 10/504* (2013.01)

(58) Field of Classification Search
CPC ..... H01S 5/042; H01S 5/0427; H04B 10/504; H03K 5/1565
See application file for complete search history.

(56) References Cited

U.S. PATENT DOCUMENTS

| | | |
|---|---|---|
| 4,835,759 A | 5/1989 | Saito et al. |
| 6,137,306 A | 10/2000 | Hirata et al. |
| 6,181,659 B1 | 1/2001 | Kobayashi |
| 6,256,329 B1 | 7/2001 | Ishizuka et al. |
| 2005/0207761 A1 | 9/2005 | Ikeuchi |

(Continued)

FOREIGN PATENT DOCUMENTS

| | | |
|---|---|---|
| JP | 11-261485 | 9/1999 |
| JP | 2005-303974 | 10/2005 |

(Continued)

OTHER PUBLICATIONS

USPTO, (Zhang) Notice of Allowance and Notice of Allowability, dated Mar. 26, 2018, in parent U.S. Appl. No. 15/378,629 [allowed].

(Continued)

*Primary Examiner* — Yuanda Zhang
(74) *Attorney, Agent, or Firm* — Fujitsu Patent Center

(57) ABSTRACT

A drive circuit of a light emitting element, the drive circuit includes: an input terminal configured to receive an input signal; an output terminal configured to output a signal based on the input signal as a drive signal to the light emitting element; and a main body circuit configured to generate the drive signal by carrying out timing correction to reduce a difference from a standard delay value for rising or falling of a plurality of signal patterns of the input signal regarding a timing of rising of a first signal subsequent to a first signal pattern in the plurality of signal patterns or a timing of falling of a second signal subsequent to a second signal pattern in the plurality of signal patterns.

2 Claims, 9 Drawing Sheets

(56) References Cited

U.S. PATENT DOCUMENTS

| | | | |
|---|---|---|---|
| 2007/0115752 A1 | 5/2007 | Sohn et al. | |
| 2012/0045217 A1* | 2/2012 | Tsunoda | H03K 5/1565 398/182 |
| 2015/0207500 A1 | 7/2015 | Tsunoda | |
| 2015/0358001 A1 | 12/2015 | Sridhar et al. | |

FOREIGN PATENT DOCUMENTS

| | | |
|---|---|---|
| JP | 2007-143159 | 6/2007 |
| JP | 2015-139039 | 7/2015 |

OTHER PUBLICATIONS

USPTO, (Zhang) Non-Final Rejection, dated Jan. 5, 2018, in parent U.S. Appl. No. 15/378,629 [allowed].

USPTO, (Zhang) Restriction Requirement, dated Sep. 20, 2017, in parent U.S. Appl. No. 15/378,629 [allowed].

* cited by examiner

JITTER IS LARGE

JITTER: 13.4 ps

JITTER: 9.2 ps

REMAINING JITTER 2

JITTER:
9.2 ps

JITTER:
7.5 ps

DRIVE CIRCUIT OF LIGHT EMITTING ELEMENT

CROSS-REFERENCE TO RELATED APPLICATION

This application is a divisional of application Ser. No. 15/378,629, filed Dec. 14, 2016, which is based upon and claims the benefit of priority of the prior Japanese Patent Application No. 2016-017692, filed on Feb. 2, 2016, the entire contents of which are incorporated herein by reference.

FIELD

The embodiments discussed herein are related to a drive circuit of a light emitting element.

BACKGROUND

The light emitting element includes a semiconductor laser (laser diode (LD) or vertical cavity surface emitting laser (VCSEL)) and so forth.

A related art is disclosed in Japanese Laid-open Patent Publication No. 2015-139039, Japanese Laid-open Patent Publication No. 2005-303974, Japanese Laid-open Patent Publication No. 11-261485, or Japanese Laid-open Patent Publication No. 2007-143159.

SUMMARY

According to an aspect of the embodiments,

A drive circuit of a light emitting element, the drive circuit includes: an input terminal configured to receive an input signal; an output terminal configured to output a signal based on the input signal as a drive signal to the light emitting element; and a main body circuit configured to generate the drive signal by carrying out timing correction to reduce a difference from a standard delay value for rising or falling of a plurality of signal patterns of the input signal regarding a timing of rising of a first signal subsequent to a first signal pattern in the plurality of signal patterns or a timing of falling of a second signal subsequent to a second signal pattern in the plurality of signal patterns.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Regarding modulation of a light emitting element, in a direct modulation system, an LD or the like is directly driven to emit light by a drive signal of ON/OFF and conversion to an optical signal of ON/OFF is carried out. In the direct modulation system, the LD nonlinearly responds due to characteristics such as relaxation oscillation and timing deviation (jitter) of rising/falling of an optical signal becomes large.

For example, the optical signal is subjected to waveform shaping by executing signal processing of addition or subtraction with signal delay difference for a drive signal (input data, input signal). The jitter may not be sufficiently reduced even by the waveform shaping. For example, a signal pattern of "0" and "1" of the drive signal is detected and a pulse width of a specific signal pattern is adjusted.

For example, in pulse width adjustment, the pulse width of the specific signal pattern of the drive signal is adjusted. However, because the pulse width adjustment does not correspond to nonlinear compensation of the light emitting element, the jitter may not be reduced. For example, a specific signal pattern corresponding to optical transmission deterioration as a compensation target is detected. For example, pulse width adjustment at the time of falling of the drive signal may not be carried out because the detection of the specific signal pattern relates to rising. For example, responding to nonlinear compensation in which delays different between the rising and falling of the signal subsequent to the specific signal pattern occur may not be carried out.

For example, compensation in consideration of the following facts may not be carried out and the jitter of the optical signal may not be sufficiently reduced: the fact that the delay of the signal subsequent to the specific signal pattern of the drive signal differs for each signal pattern due to the nonlinearity of the LD or the like, and the fact that the rising and falling of the signal subsequent to each signal pattern have different delays.

For example, a drive circuit of the light emitting element adjusts an amount of delay of the drive signal on each signal pattern basis regarding the signal pattern including a combination of values of "0" and "1" of an input signal (input data, drive signal) input to the drive circuit in the direct modulation system.

For example, the drive circuit of the light emitting element may respond to occurrence of delays of the signal subsequent to plural signal patterns of the drive signal due to the nonlinearity of the LD or the like and delays different between the rising and falling of the signal subsequent to each signal pattern. For example, by individually carrying out timing (delay) correction for the rising and falling of the signal subsequent to each signal pattern for each signal pattern, the waveform characteristics of the optical signal may be improved and the jitter may be reduced.

Figure 1A:
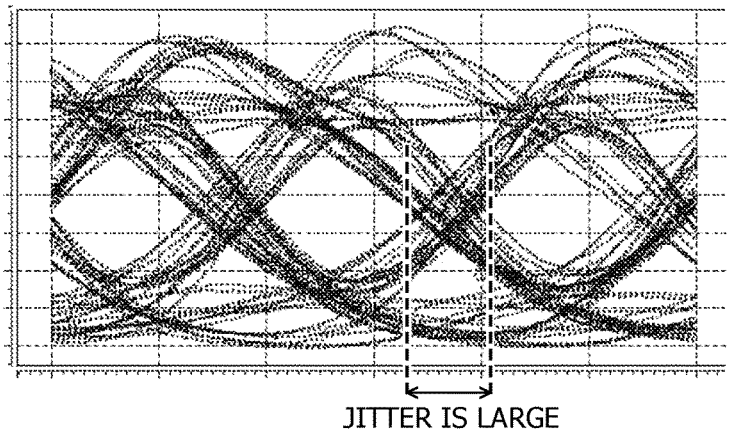
FIGS. 1A to 1D illustrate one example of edge delays of an optical signal on each signal pattern basis due to nonlinearity of a light emitting element.

Delays of the optical signal on each signal pattern basis due to the nonlinearity of the light emitting element occur. FIG. 1A to FIG. 1D illustrate one example of edge delays of an optical signal on each signal pattern basis due to nonlinearity of a light emitting element. FIG. 1A illustrates waveforms of the optical signal. The abscissa axis indicates the time and the ordinate axis indicates the optical power. The waveform illustrated in FIG. 1A may be, for example, a waveform example after application of a technique of Japanese Laid-open Patent Publication No. 2015-139039 and a jitter greatly occurs due to the nonlinearity of an LD.

Figure 1B:
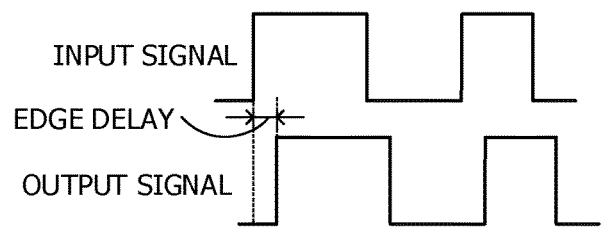

FIG. 1B corresponds to FIGS. 1A and 1s a waveform diagram illustrating an input signal to a drive circuit and an output signal (optical signal). In FIG. 1B, with respect to rising and falling of an input signal, a delay (edge delay) occurs in each of the rising and falling of the output signal.

Figure 1C:
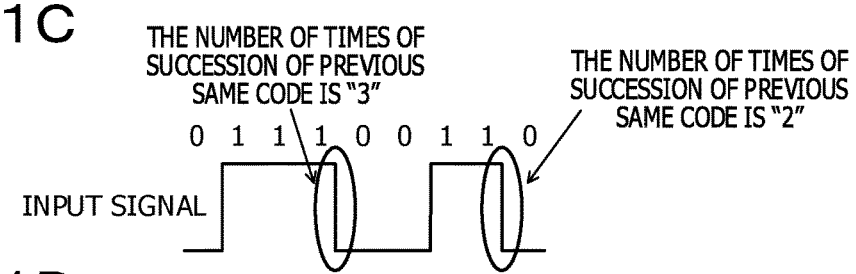

FIG. 1C illustrates examples of a signal pattern of the input signal. Regarding the falling "1→0" of the input signal, an example of a signal pattern "01110," in which the number of times of succession of the previous same code (the number of times of succession of "1") is three, and an example of a signal pattern "0110," in which the number of times of succession of the previous same code is two, are illustrated.

Figure 1D:
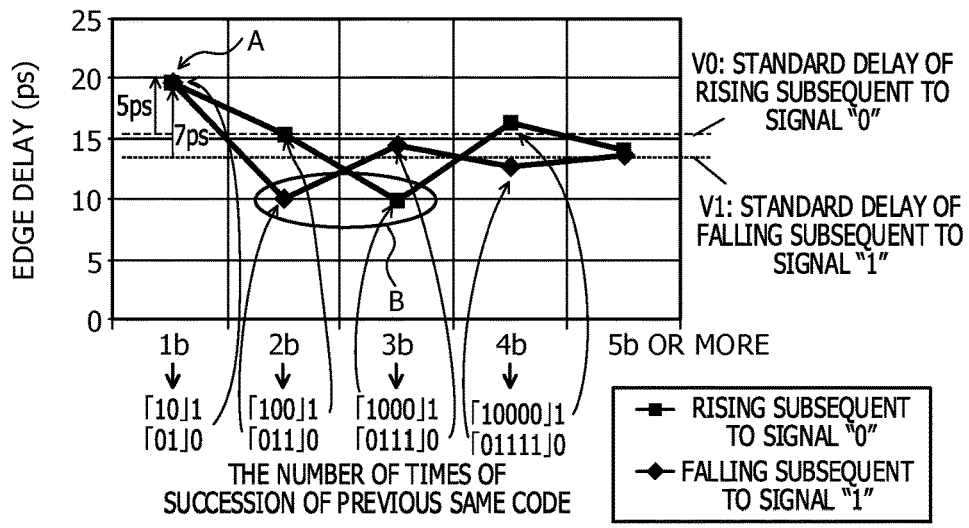

FIG. 1D illustrates the number of times of succession of the same code and the edge delay (time) in an optical signal at a transmission speed of 25 Gbps. The abscissa axis indicates the number of times of succession of the same code (the number of times of succession of "1") and the ordinate axis indicates the edge delay. In the vicinity of the center in the ordinate axis direction, a standard delay (average value of the delay time of the respective patterns) V0 of rising subsequent to the signal "0" and a standard delay V1 of falling subsequent to the signal "1" are illustrated.

Regarding the rising subsequent to the signal "0", the edge delay of the rising in "101," in which the number of times of succession of the same code "0" is one, is 20 ps (difference from the standard delay V0 is +5 ps). The edge delay of the rising in "1001," in which the number of times of succession of the same code "0" is two, is 15 ps (difference from the standard delay V0 is 0 ps). The edge delay of the rising in "10001," in which the number of times of succession of the same code "0" is three, is 10 ps (difference from the standard delay V0 is −5 ps). The edge delay of the rising in "100001," in which the number of times of succession of the same code "0" is four, is 17 ps (difference from the standard delay V0 is +2 ps). The edge delay of the rising subsequent to five or more successive same codes "0" is 14 ps (difference from the standard delay V0 is −1 ps). + indicates the state in which the timing is later (further delayed) than the standard delay, and − indicates the state in which the timing is earlier than the standard delay.

Regarding the falling subsequent to the signal "1", the edge delay of the falling in "010," in which the number of times of succession of the same code "1" is one, is 20 ps (difference from the standard delay V1 is +7 ps). The edge delay of the falling in "0110," in which the number of times of succession of the same code "1" is two, is 10 ps (difference from the standard delay V1 is −3 ps). The edge delay of the falling in "01110," in which the number of times of succession of the same code "1" is three, is 14 ps (difference from the standard delay V1 is +1 ps). The edge delay of the falling in "011110," in which the number of times of succession of the same code "1" is four, is 13 ps (difference from the standard delay V1 is 0 ps). The edge delay of the falling subsequent to five or more successive same codes "1" is 14 ps (difference from the standard delay V1 is +1 ps).

The following facts (1) to (3) may be found by waveform observation of the input signal and the output signal (optical signal) like those illustrated in FIG. 1D, and so forth.

(1) The timings of the rising and falling of the signal differ depending on the signal pattern of the input signal.

(2) The falling of "0" subsequent to the signal pattern "01" and the rising of "1" subsequent to the reverse signal pattern "10" are both late compared with the other signal patterns. However, when the delays are compared with the standard delays V0 and V1, the difference from the standard delay is different between both. For example, in the case where the transmission speed of the optical signal is 25 Gbps, the timing is later by 7 ps in "0 (falling)" subsequent to "01" whereas the timing is later by 5 ps in "1 (rising)" subsequent to "10" (part A in FIG. 1D).

(3) "0 (falling)" subsequent to the signal pattern "011" and "1 (rising)" subsequent to "1000" are specifically early (part B in FIG. 1D).

For this reason, the amount of delay may be adjusted for each signal pattern, for example. The signal pattern is input to the drive circuit in a predefined manner. Therefore, in response to the input signal of a specific signal pattern, the drive signal given an individual amount of delay is generated and supplied to the LD.

Figure 2:
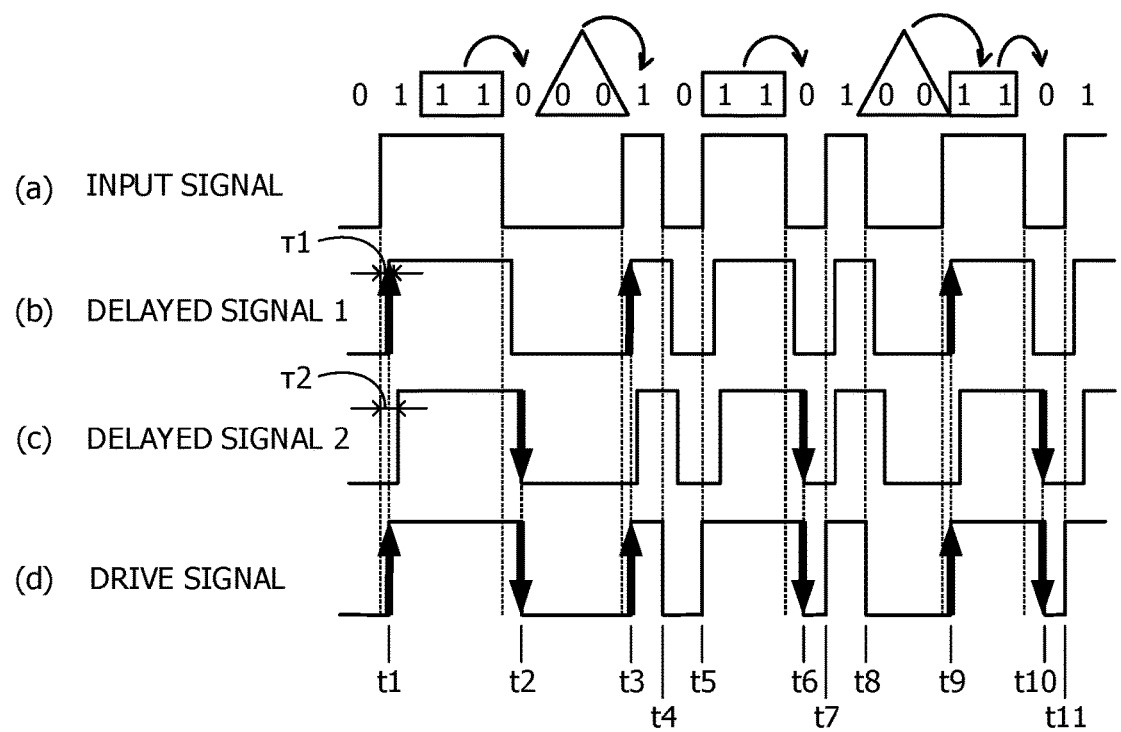
FIG. 2 illustrates one example of delay control for a signal pattern of an input signal.

FIG. 2 illustrates one example of delay control for a signal pattern of an input signal. The abscissa axis indicates the time and the ordinate axis indicates (a) the input signal, individual delayed signals for specific signal patterns ((b) delayed signal 1, (c) delayed signal 2), and (d) the drive signal output to the LD.

For example, for "0 (falling)" subsequent to the signal pattern "01" and "1 (rising)" subsequent to "10," the delay (time) is adjusted according to the signal pattern because these falling and rising are late compared with the other signal patterns. These "01" and "10" may be past signal patterns with respect to the target signal.

For example, the value (level) does not change (rising/falling does not exist) at "1" subsequent to the signal pattern "01" and at "0" subsequent to "10." Therefore, the drive signal itself is delayed in the case of a signal other than the signals of "01" and "10" (for example, "00" and "11").

The delay time 5 ps of "1" subsequent to the signal pattern "10" with respect to the standard delay V0 is different from the delay time 7 ps of "0" subsequent to the signal pattern "01" with respect to the standard delay V1 (see part A in FIG. 1D). For this reason, the delay (time) is individually adjusted in the rising and falling of the signal subsequent to the signal pattern in the case on each signal pattern basis.

For example, because it is difficult to advance a signal in which a delay has occurred, signals (drive signals) other than "0" subsequent to the signal pattern "01" and "1" subsequent to the signal pattern "10" are delayed. In this case, "1" subsequent to the signal pattern "01" and "0" subsequent to the signal pattern "10" do not have to be delayed. When a consideration is made regarding two bits, signal patterns other than the signal patterns "01" and "10" are "00" and "11." For this reason, as illustrated in FIG. 2, the delayed signal 1 is given to the signal "1 (rising)" subsequent to the signal pattern "00." The delayed signal 2 is given to the signal "0 (falling)" subsequent to the signal pattern "11." A relationship of the delayed signal 1<the delayed signal 2 is established corresponding to the amounts of delay at part A in FIG. 1D.

The drive signal includes the delayed signal 1 and the delayed signal 2. At signal rising timings t1, t3, and t9, the input signal is delayed by a delay time $\tau 1$ due to the delayed signal 1. At timings t5, t7, and t11, a delay is not added to the input signal and the input signal is used as the drive signal as it is. At signal falling timings t2, t6, and t10, the input signal is delayed by a delay time $\tau 2$ due to the delayed signal 2. At timings t4 and t8, a delay is not added to the input signal and the input signal is used as the drive signal as it is.

Figure 3:
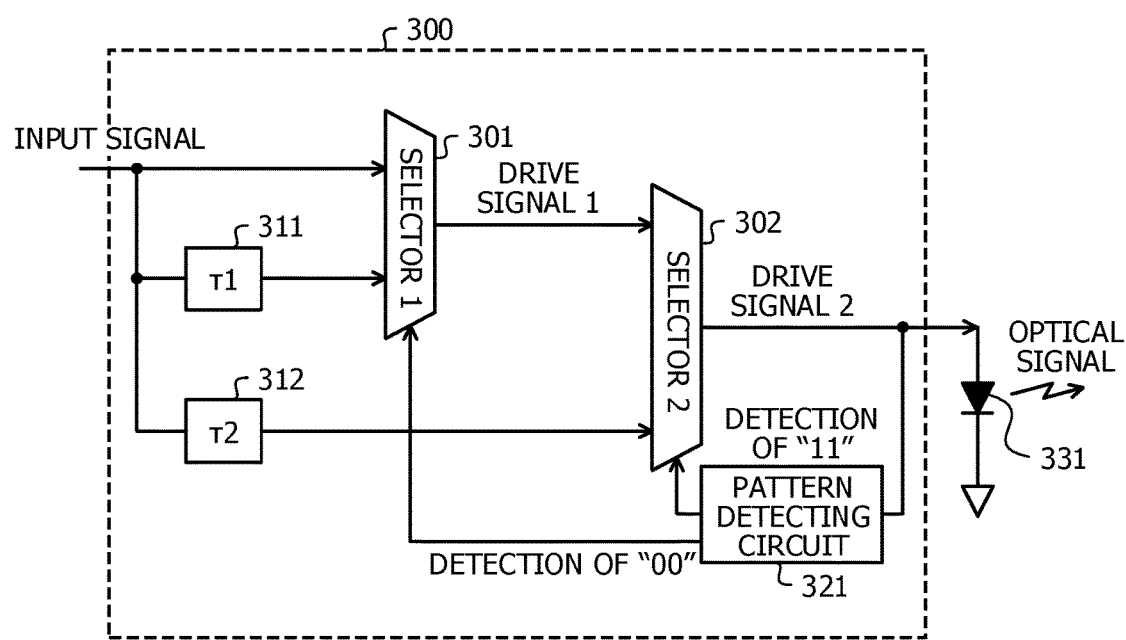
FIG. 3 illustrates one example of a drive circuit of a light emitting element.

FIG. 3 illustrates one example of a drive circuit of a light emitting element. The drive circuit illustrated in FIG. 3 may have a circuit configuration that gives the delay times of the delayed signals 1 and 2 to the input signal illustrated in FIG. 2. A drive circuit 300 includes two selectors 1 and 2 (301 and 302), delay circuits 1 and 2 (311 and 312), and a pattern detecting circuit 321. The input signal is split into three channels. The signal on the first channel is input to the selector 1 (301). The signal on the second channel is input to the delay circuit 311 of a delay time 1 (first delay time $\tau 1$). The signal on the third channel is input to the delay circuit 312 of a delay time 2 (second delay time $\tau 2$).

The pattern detecting circuit 321 controls the selectors 1 and 2 (301 and 302) when detecting specific signal patterns "00" and "11."

The selector 1 (301) selects the output of the delay circuit 1 (311) (delayed signal 1) and outputs the selected output as a drive signal 1 based on control when the pattern detecting circuit 321 detects the specific signal pattern "00." When a signal pattern other than the specific signal pattern "00" is detected, the selector 1 (301) selects the input signal and outputs the input signal as the drive signal 1.

The selector 2 (302) selects the output of the delay circuit 2 (312) (delayed signal 2) and outputs the selected output as a drive signal 2 based on control when the pattern detecting circuit 321 detects the specific signal pattern "11." When a signal pattern other than the specific signal pattern "11" is detected, the selector 2 (302) selects the drive signal 1 and outputs the drive signal 1 as the drive signal 2. The drive signal 2 is supplied to an LD 331 as the light emitting element and drives the LD 331 for light emission. A signal obtained by detecting an optical signal by the light emission of the LD 331 by a photodiode (PD) or the like is the above-described output signal.

Figure 4:
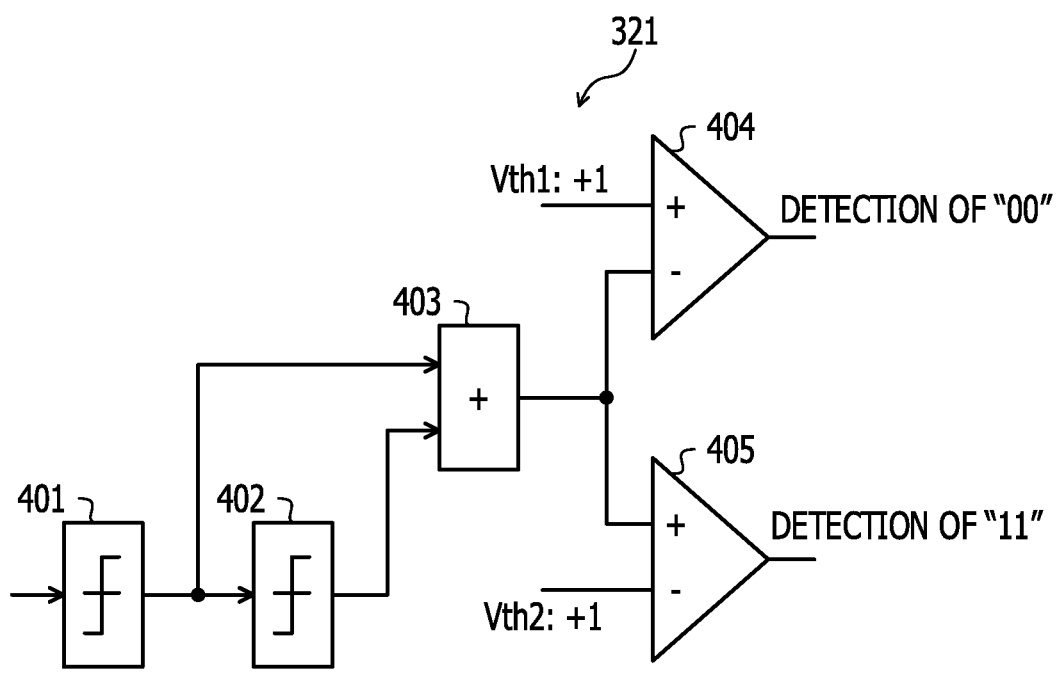
FIG. 4 illustrates one example of a pattern detecting circuit provided in a drive circuit of a light emitting element.

FIG. 4 illustrates one example of a pattern detecting circuit provided in a drive circuit of a light emitting element. In FIG. 4, the internal configuration of the pattern detecting circuit 321 illustrated in FIG. 3 is illustrated. The drive signal 2 is split and input to the pattern detecting circuit 321 and the pattern detecting circuit 321 detects the specific signal pattern "11," with which the largest delay occurs (difference in the delay from the standard delay V0 or V1 is large), and the signal pattern "00" relating to the second largest delay.

The pattern detecting circuit 321 includes identifying circuits 1 and 2 (401 and 402), an addition circuit 403, and comparators 1 and 2 (404 and 405).

The identifying circuits 1 and 2 (401 and 402) may include a flip-flop (FF) and so forth, for example. The identifying circuit 1 (401) holds the value of the bit previous by one bit of the drive signal 2 and outputs the held value to the identifying circuit 2 (402) and the addition circuit 403. The identifying circuit 2 (402) holds the value of the bit previous by two bits of the drive signal 2 and outputs the held value to the addition circuit 403.

The addition circuit 403 adds the values of the two bits of the drive signal 2 held and output by the identifying circuits 1 and 2 (401 and 402) and outputs the value resulting from the addition to each of the negative input terminal of the comparator 1 (404) and the positive input terminal of the comparator 2 (405). A given threshold Vth1 for determination is input to the positive input terminal of the comparator 1 (404) and a given threshold Vth2 for determination is input to the negative input terminal of the comparator 2 (405).

The comparator 1 (404) outputs a control signal to the selector 1 when detecting that the successive two bits of the drive signal 2 are the specific signal pattern "00." For example, by setting Vth1 to +1, the specific pattern "00" is detected when the output of the addition circuit 403 is 0 (values of the successive two bits are 0+0).

The comparator 2 (405) outputs the control signal to the selector 2 when detecting that the successive two bits of the drive signal 2 are the specific signal pattern "11." For example, by setting Vth2 to +1, the specific pattern "11" is detected when the output of the addition circuit 403 is 2 (values of the successive two bits are 1+1).

Figure 5A:
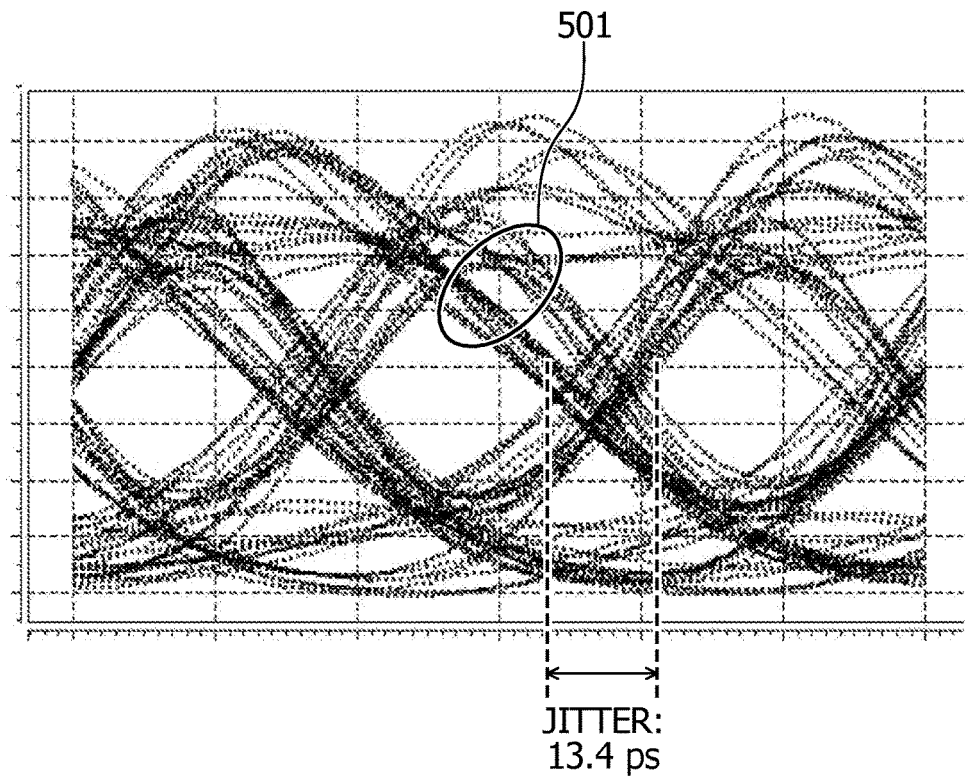
FIG. 5A and FIG. 5B illustrate one example of jitter reduction by a drive circuit of a light emitting element.
Figure 5B:
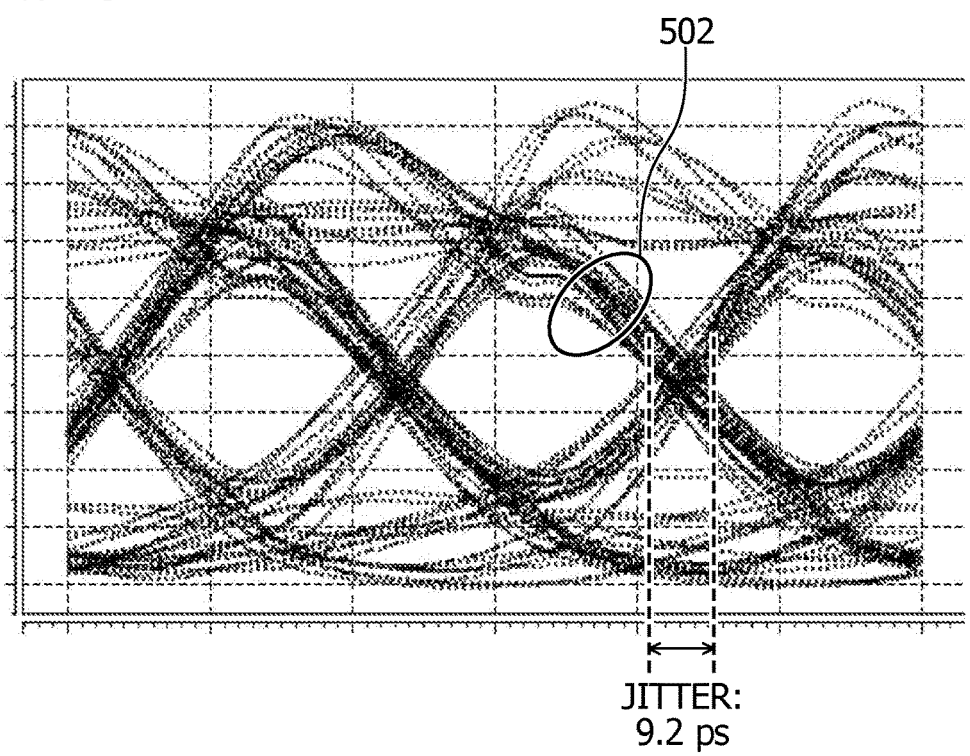

FIG. 5A and FIG. 5B illustrate one example of jitter reduction by a drive circuit of a light emitting element. FIG. 5A illustrates an optical waveform for comparison and may be an optical waveform illustrated in Japanese Laid-open Patent Publication No. 2015-139039, for example. FIG. 5B illustrates an optical waveform based on the above-described technique.

By delaying the rising of "1" subsequent to the signal "00" and the falling of "0" subsequent to the signal "11", which are a cause of the jitter, by the individual delay times, the timings may be properly adjusted and the jitter may be reduced. In FIG. 5A and FIG. 5B, the transmission speed of the optical signal is 25 Gbps. Although the jitter component (jitter in the phase direction) is 13.4 ps in FIG. 5A, the jitter component is reduced to 9.2 ps in FIG. 5B. In FIG. 5A, a waveform 501 at the upper right part of an eye opening is in a broad state. However, in FIG. 5B, an improvement effect in which a waveform 502 at the upper right part of an eye opening becomes narrow and linear is obtained.

Because the individual delay time is adjusted regarding each of the signal subsequent to "11" and the signal subsequent to "00" among specific signal patterns, both signals are adjusted to the optimum timing and the jitter may be reduced.

Figure 6:
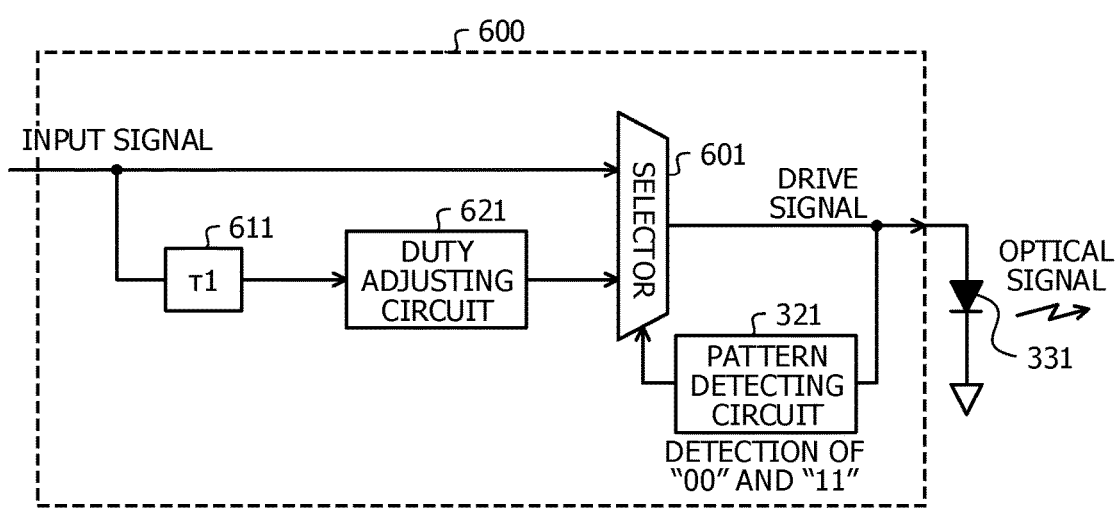
FIG. 6 illustrates one example of a drive circuit of a light emitting element.
Figure 7:
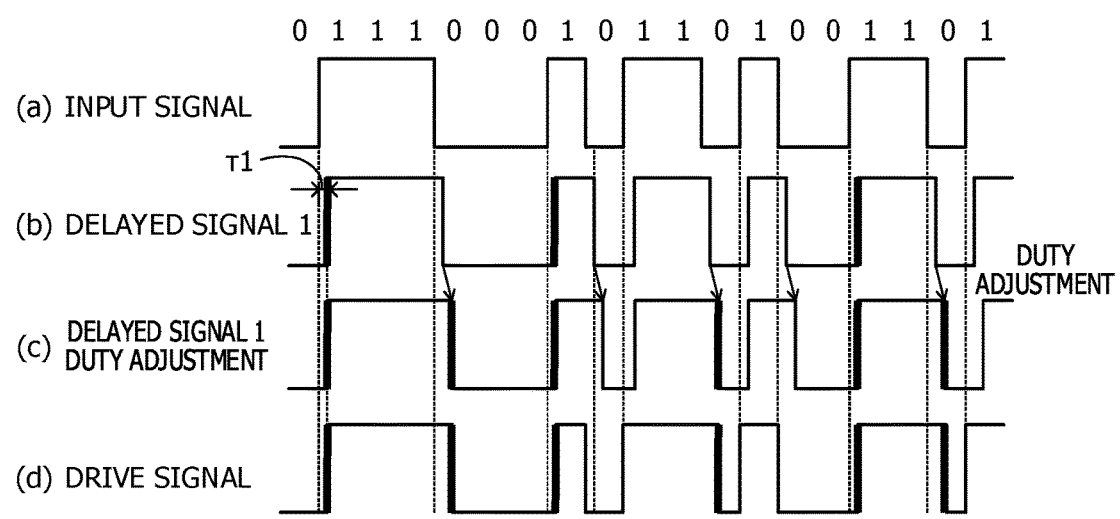
FIG. 7 illustrates one example of delay control for a signal pattern of an input signal.

FIG. 6 illustrates one example of a drive circuit of a light emitting element. In FIG. 6, although a configuration that splits an input signal and gives delays is similar to that in FIG. 3, a configuration in which the duty of the signal is adjusted is different.

A drive circuit 600 illustrated in FIG. 6 includes a selector 601, a delay circuit 611, a duty adjusting circuit 621, and the pattern detecting circuit 321.

The input signal is split into two channels. The signal on the first channel is input to the selector 601. The signal on the second channel is input to the delay circuit 611 of the delay time 1 ($\tau 1$).

The pattern detecting circuit 321 controls the selector 601 when detecting the specific signal pattern "00" or "11."

The selector 601 selects the output of the delay circuit 611 (delayed signal 1) and outputs the selected output as the drive signal based on the control when the pattern detecting circuit 321 detects the specific signal pattern "00" or "11." When a signal pattern other than the specific signal patterns "00" and "11" is detected, the selector 601 selects the input signal and outputs the input signal as the drive signal. The drive signal is supplied to the LD 331 as the light emitting element and drives the LD 331 for light emission.

FIG. 7A to FIG. 7D illustrate one example of delay control for a signal pattern of an input signal. The pattern of the input signal illustrated in FIG. 7A may be similar to the pattern illustrated in FIG. 2.

To the delayed signal 1 illustrated in FIG. 7B, a delay of the delay time $\tau 1$ by the delay circuit 611 is given with respect to the input signal. For example, in the delay circuit 611, a delay time with which the rising "1" of the signal subsequent to the specific signal pattern "00" is optimized is set. The delayed signal of the delay circuit 611 is input to the duty adjusting circuit 621.

As illustrated in FIG. 7C, in the duty adjusting circuit 621, the rising of the signal is left as it is and the delay of the rising "1" subsequent to "00" is set to the optimum state, and the falling "0" of the signal is all delayed by duty adjustment. For example, the delay of the falling "0" subsequent to "11" may be adjusted to be optimized.

As illustrated in FIG. 7D, based on control by the pattern detecting circuit 321, the selector 601 selects and outputs the output of the duty adjusting circuit 621 as the drive signal regarding the rising "1" subsequent to "00" and the falling "0" subsequent to "11," "00" and "11" being the specific signal pattern. Regarding a signal pattern other than the specific signal patterns, the selector 601 outputs the input signal as it is.

As described above, the configuration obtained by combining the delay circuit and the duty adjusting circuit as the drive circuit 600 may provide the similar effects to the configuration illustrated in FIG. 3, and the optimum delay may be given regarding the specific signal patterns. In the configuration illustrated in FIG. 6, the number of channels into which the input signal is split is reduced compared with the configuration illustrated in FIG. 3 and the numbers of delay circuits and selectors are reduced.

Figure 8:
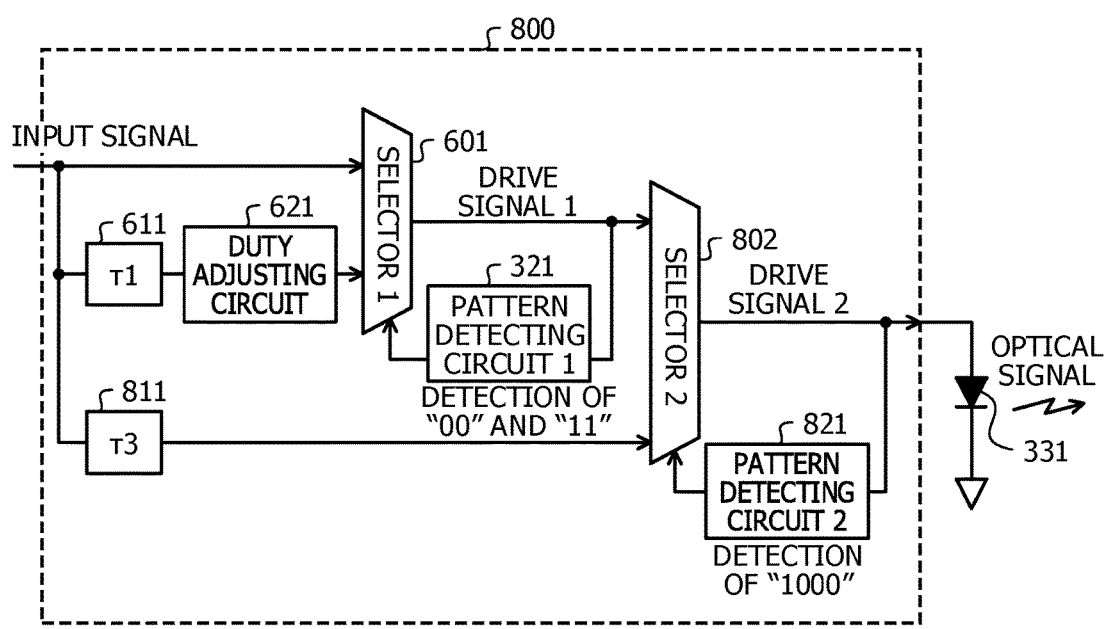
FIG. 8 illustrates one example of a drive circuit of a light emitting element.

FIG. 8 illustrates one example of a drive circuit of a light emitting element. In FIG. 8, the number of specific signal patterns for which a delay is given to the signal is increased. In FIG. 8, besides the signals of the specific signal patterns "00" and "11" illustrated in FIG. 3 and FIG. 6, a delay according to the signal is given also to the signal subsequent to a "1000" signal.

In FIG. 8, the input signal is split into three channels, and the delay circuit 611 that has the first delay time τ1 and delays the signal, the duty adjusting circuit 621, the selector 1 (601), and the pattern detecting circuit 1 (321) correspond to a front-stage circuit. The configuration of the front-stage circuit may be similar to the configuration illustrated in FIG. 6. The configuration of the front-stage circuit may be the configuration illustrated in FIG. 3. The pattern detecting circuit 1 (321) detects the specific signal patterns "00" and "11."

A rear-stage circuit includes a selector 2 (802) that switches the output of a delay circuit 811 that delays the input signal by a delay time 3 (third delay time τ3) and the output of the drive signal 1 of the selector 1 (601). A pattern detecting circuit 2 (821) applies the delay time τ3 according to the signal also to the signal subsequent to the specific signal pattern "1000" represented at part B in FIG. 1D regarding the drive signal 2 output by the selector 2 (802).

For this purpose, when detecting the specific signal pattern "1000," the pattern detecting circuit 2 (821) switches the selector 2 (802) and outputs the signal given the delay time τ3 of the delay circuit 811 as the drive signal 2. The delay time τ3 may be set to 5 ps based on FIG. 1D.

Figure 9A:
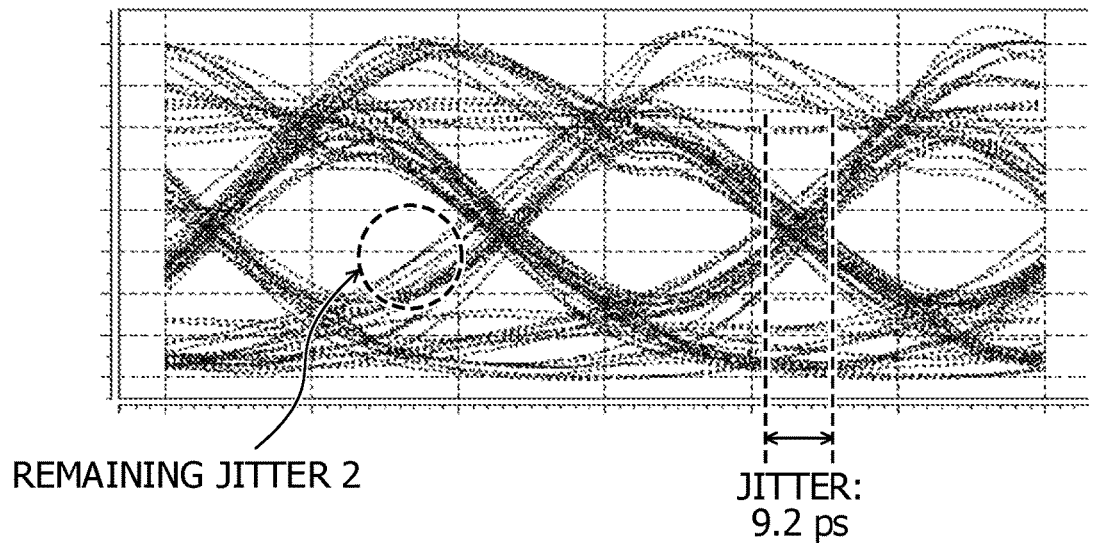
FIG. 9A and FIG. 9B illustrate one example of jitter reduction by a drive circuit of a light emitting element.
Figure 9B:
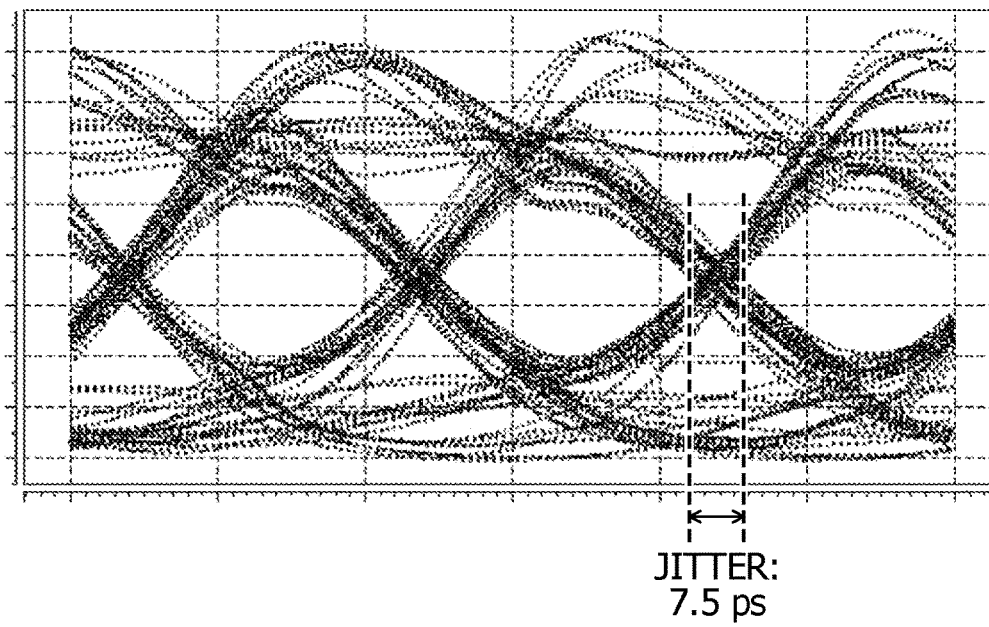

FIG. 9A and FIG. 9B illustrate one example of jitter reduction by a drive circuit of a light emitting element. FIG. 9A is the optical waveform illustrated in FIG. 5B and FIG. 9B is an optical waveform based on FIG. 8.

As illustrated in FIG. 9A, the signal subsequent to "11" and the signal subsequent to "00" among the specific signal patterns are each adjusted with the individual delay time as with the configuration of FIG. 3. Thus, both signals may be adjusted to the optimum timing and the jitter may be reduced. The jitter at this time is 9.2 ps.

For example, delay adjustment is individually carried out also regarding the signal subsequent to the specific signal pattern "1000." Thus, the jitter is reduced to 7.5 ps as illustrated in FIG. 9B. By the drive circuit illustrated in FIG. 8, adjustment of the signal timings each corresponding to a respective one of various signal patterns may be carried out and the jitter may be further reduced.

For example, the input signal may be split and a pattern detecting circuit that detects a specific pattern "011," a delay circuit 4 of a fourth delay time τ4, and another selector (selector 3) may be added. In this case, the fourth delay time τ4 of the delay circuit 4 may be set to 3 ps based on FIG. 1D. For this reason, adjustment of the signal timings each corresponding to a respective one of more various signal patterns may be carried out and the jitter may be further reduced.

For example, a specific signal pattern in which the same codes are successive and with which a delay occurs is determined. Different delay times are set for the rising and falling of the signal subsequent to the specific signal pattern, respectively, and timing correction that brings all of the various kinds of signal patterns closer to the standard delay is carried out. For this reason, whatever signal pattern is input as the input signal, occurrence of a large delay (edge delay) in the signal subsequent to the specific signal pattern may be reduced and the jitter may be reduced. For example, the jitter may be reduced by delaying the timing of a signal as a cause of the jitter.

By increasing the number of channels into which the input signal is split in the drive circuit and carrying out individual delay adjustment for a specific signal pattern on each split channel basis, the delay is brought closer to the standard delay in all of various signal patterns corresponding to the various signal patterns. For example, the jitter may be further reduced by individually carrying out delay adjustment regarding each signal pattern illustrated in FIG. 1D.

In the case of decreasing the number of channels into which the input signal is split in the drive circuit, the jitter reduction effect may be obtained by only adjusting the delay regarding at least the signals subsequent to "01" and "10," which have a large difference from the standard delay, as illustrated in FIG. 3 to FIG. 7. In this case, because the signals subsequent to "01" and "10" have timings later than the standard delays V0 and V1 as described above, delay adjustment for the signals subsequent to the signals of "00" and "11," which are signals other than "01" and "10," is carried out and timing adjustment is carried out.

The above-described drive circuit may be applied to various kinds of optical transmitting parts and optical transmitting equipment, such as optical transmitters and optical transmitting units including a light emitting element.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A drive circuit of a light emitting element, the drive circuit comprising:
an input terminal configured to receive an input signal;

an output terminal configured to output a signal based on the input signal as a drive signal to the light emitting element;

a main body circuit configured to generate the drive signal by carrying out timing correction to reduce a difference from a standard delay value for rising or falling of a plurality of signal patterns of the input signal regarding a timing of rising of a first signal subsequent to a first signal pattern in the plurality of signal patterns or a timing of falling of a second signal subsequent to a second signal pattern in the plurality of signal patterns;

a pattern detecting circuit configured to determine the first signal pattern and the second signal pattern;

a first delay circuit configured to delay rising of the first signal detected by the pattern detecting circuit by a first delay time;

a duty adjusting circuit configured to delay falling of the second signal output by the first delay circuit through change in duty of the second signal; and a first selector configured to supply one of the input signal and an output of the duty adjusting circuit to the output terminal based on a determination result of the pattern detecting circuit, a second delay circuit configured to delay a third signal, which is subsequent to a third signal pattern in the plurality of signal patterns, in rising by a second delay time corresponding to a difference between a rising time of the third signal and the standard delay value for rising; and a second selector to which an output of the first selector and an output of the second delay circuit are input, the first selector and the second selector are switched based on the determination result of the pattern detecting circuit and one of the input signal, the output of the duty adjusting circuit and the output of the second delay circuit is supplied to the output terminal.

2. The drive circuit according to claim 1, further comprising:

a third delay circuit configured to delay a fourth signal, which is subsequent to a fourth signal pattern in the plurality of signal patterns, in falling by a third delay time corresponding to a difference between a falling time of the fourth signal and the standard delay value for falling; and a third selector to which an output of the second selector or an output of the third delay circuit is input, and the first to third selectors are each switched based on the determination result of the pattern detecting circuit and one of the input signal, the output of the duty adjusting circuit, the output of the second delay circuit, and the output of the third delay circuit is supplied to the output terminal.

* * * * *